(12) United States Patent
Sheck

(10) Patent No.: US 6,933,523 B2
(45) Date of Patent: Aug. 23, 2005

(54) SEMICONDUCTOR ALIGNMENT AID

(75) Inventor: Stephen G. Sheck, Marble Falls, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 76 days.

(21) Appl. No.: 10/402,539

(22) Filed: Mar. 28, 2003

(65) Prior Publication Data
US 2004/0188709 A1 Sep. 30, 2004

(51) Int. Cl.[7] .................. H01L 23/58; H01L 29/80; H01L 23/29; H01L 21/8234; H01L 21/302
(52) U.S. Cl. .................. 257/48; 257/283; 257/797; 257/798; 257/E23.19; 438/710; 438/238; 438/239; 438/240; 438/241
(58) Field of Search .................. 257/283, 48, 797, 257/798, E23.19

(56) References Cited

U.S. PATENT DOCUMENTS

| | | | | |
|---|---|---|---|---|
| 4,425,037 A | * | 1/1984 | Hershel et al. | 355/43 |
| 4,444,492 A | * | 4/1984 | Lee | 355/55 |
| 5,162,867 A | * | 11/1992 | Kohno | 356/237.5 |
| 5,287,140 A | * | 2/1994 | Kohno | 396/244 |
| 5,781,682 A | * | 7/1998 | Cohen et al. | 385/89 |
| 5,952,135 A | * | 9/1999 | Ghandehari et al. | 430/22 |
| 5,986,319 A | | 11/1999 | Huggins | |
| 6,117,620 A | * | 9/2000 | Imaino et al. | 430/320 |
| 6,307,273 B1 | | 10/2001 | Chien et al. | |
| 6,423,908 B1 | * | 7/2002 | Liu | 174/261 |
| 6,452,284 B1 | * | 9/2002 | Sheck | 257/797 |
| 6,465,898 B1 | * | 10/2002 | Hnilo et al. | 257/797 |
| 6,613,688 B1 | * | 9/2003 | Brown et al. | 438/710 |
| 6,629,292 B1 | * | 9/2003 | Corson et al. | 716/3 |
| 6,661,106 B1 | * | 12/2003 | Gilmour et al. | 257/797 |
| 2002/0142494 A1 | | 10/2002 | Farnworth et al. | |
| 2002/0179902 A1 | | 12/2002 | Travis et al. | |

* cited by examiner

Primary Examiner—Long Pham
Assistant Examiner—Shrinivas H. Rao
(74) Attorney, Agent, or Firm—David G. Dolezal; Robert L. King

(57) ABSTRACT

An alignment aid for semiconductor devices. The alignment aid includes an area having a high level of reflectivity and an adjacent area having a of low level of reflectivity. The area having a low level of reflectivity includes at least one layer of tiles located in an interconnect layer of a semiconductor device and located over active circuitry of the semiconductor device. In some examples, the spacings between the tiles in a scan direction of the alignment aid is less than the wavelength of a light (e.g. a laser light) used to scan the alignment aid. In other examples, the width of the tiles in a scan direction of the alignment aid is less than the wave length of a laser used to scan the alignment aid.

22 Claims, 3 Drawing Sheets

US 6,933,523 B2

SEMICONDUCTOR ALIGNMENT AID

BACKGROUND OF THE INVENTION

1. Field of the Invention

This invention relates in general to semiconductor devices and in particular to alignment aids for semiconductor devices.

2. Description of the Related Art

Alignment aids are utilized in the manufacture of semiconductor devices. With some processes, an alignment aid is scanned by a laser to provide an indication of location on a semiconductor wafer e.g. for the purpose of blowing fuses. Typically, an alignment aid includes an alignment feature area which provides a first level of reflectivity to light and a background area adjacent to the alignment feature that provides a second level of reflectivity to light that is in substantial contrast to the first level. With a positive density alignment aid, the alignment feature provides a high level of reflectivity to light and the background area provides a relatively low level of reflectivity to light.

With some alignment aids, the portion of the alignment aid providing the relatively low level of reflectivity to light (e.g. the background area for a positive density alignment aid) is void of metal in the metal interconnect layers of the background area. However, these alignment aids may experience problems due to uneven polishing of the interconnect layers from the lack of patterned metal in those areas. To overcome the above described uneven polishing problem, metal tiles may be located in each of the metal interconnect layers of the background areas for improved polishing of those areas.

However, the alignment aids described above are located over areas of the wafer that are void of active circuitry in the substrate or interconnect layers. Accordingly, alignment aids described above waste wafer space in that no active circuitry is located underneath the alignment aid.

What is needed is an alignment aid that can be located over active circuitry of a semiconductor device.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. FIGS. 1, 2, and 3 are not necessarily drawn to scale.

DETAILED DESCRIPTION

The following sets forth a detailed description of a mode for carrying out the invention. The description is intended to be illustrative of the invention and should not be taken to be limiting.

Figure 1:
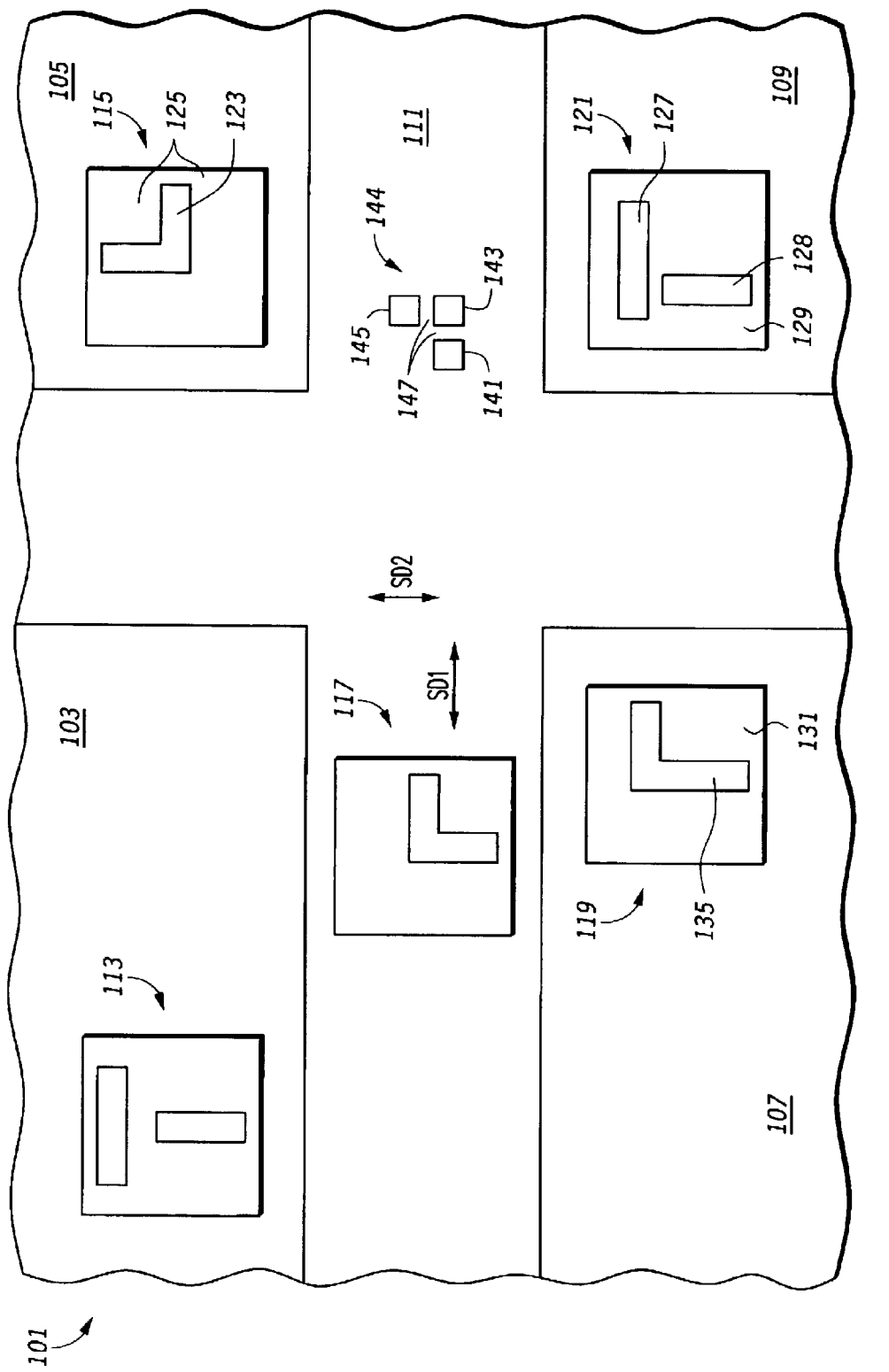
FIG. 1 is a partial top view of one embodiment of a semiconductor wafer according to the present invention.

FIG. 1 is a partial top view of one embodiment of a semiconductor wafer according to the present invention. FIG. 1 shows the corner portions of four die areas (die area 103, die area 105, die area 107, and die area 109) separated by scribe area 111. During a later stage of manufacture, the wafer is cut along scribe area 111 to singulate die areas 103, 105, 107, and 109 to form separate semiconductor die.

Wafer 101 includes a number of alignment aids for providing alignment in processing operations of the wafer. FIG. 1 shows alignment aids 113, 115, 117, 144, 119, and 121. In one example, these alignment aids are utilized for scanning by a laser to provide an indication of location for the purpose of blowing fuses These alignment aids include a feature area that provides a first level of reflectivity and a background area that provide a contrasting level of reflectivity with respect to the alignment feature area. Alignment aid 115 is a positive density alignment aid in that feature area 123 provides a higher level of reflectivity than background area 125. Alignment aid 119 is a negative density alignment aid in that background area 131 has a higher level of reflectivity than feature area 135.

Alignment aid 144 is a negative density alignment aid and includes background areas 145, 143, and 141. The feature area 147 of alignment aid 144 is a portion of the scribe area 111 adjacent to background areas 141, 143, and 145 and is defined by the relative positions of the background areas 141, 143, and 145 with respect to each other. Feature area 147 has a lower level of reflectivity and background areas 141, 143, and 145 have a higher level of reflectivity. Alignment aid 121 includes multiple feature areas (127 and 128). Those of skill in the art will recognize that, based on the teachings herein, that alignment aids according to the present invention may have other configurations other than those shown in FIG. 1. The alignment aids shown in FIG. 1 are two-dimensional alignment aids in that they can provide indication information from being scanned by a laser in two different scan directions. The scan directions for the alignment aids shown in FIG. 1 are orthogonal to each other and are parallel to arrows SD1 and SD2.

Alignment aids 113, 115, 119, and 121 are located in the die areas of wafer 101. Located beneath these alignment aids are active circuitry in both the interconnect layers and the substrate (e.g. 215) of the die area. Active circuitry includes circuitry in the substrate or interconnect layers (e.g. transistors, resistors, capacitors, diodes, signal lines, power busses etc.) utilized for the operation of the die during its end use after singulation. Providing an alignment aid located over active circuitry may allow for a more efficient use of wafer space.

Figure 2:
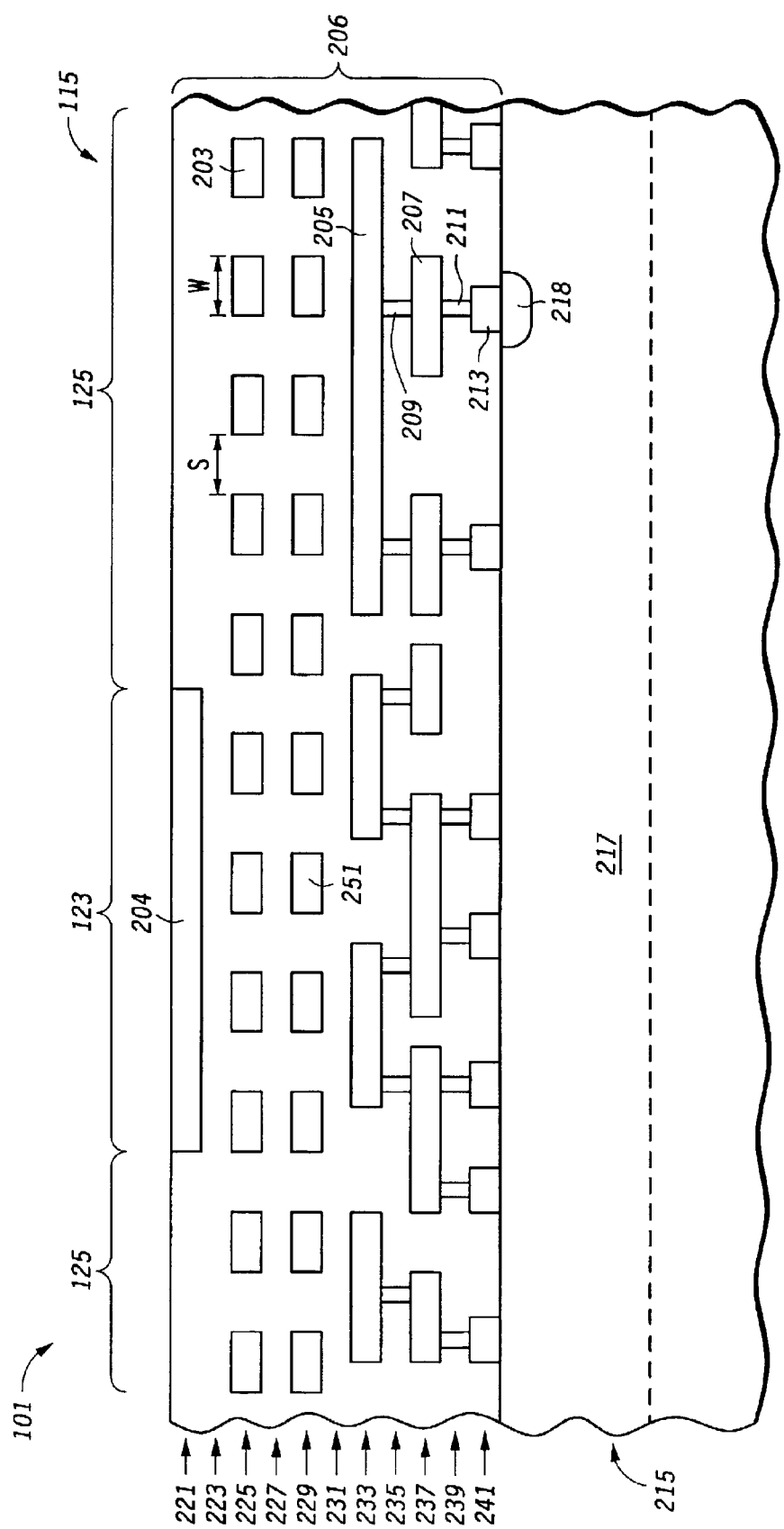
FIG. 2 is partial side view of one embodiment of a semiconductor wafer according to the present invention.

FIG. 2 is a partial side view of wafer 101 at a cross section of alignment aid 115. Wafer 101 includes an interconnect layer portion 206 located over a semiconductor substrate 215. Substrate 215 includes active circuitry 217 formed in the top portion of substrate 215 for implementing circuits of a die such as e.g. processors or memories. Examples of active circuitry 217 include e.g. transistors (e.g. 218) diodes, resistors, capacitors or other types of circuitry that may be formed in a semiconductor substrate. Interconnect layer portion 206 includes a local interconnect layer 241, a contact interconnect via layer 239, metal interconnect layers 237, 233, 229, and 225, via interconnect layers 235, 231, 227, 223, and a final metal interconnect layer 221. Other layers not shown in FIG. 2 may be located over layer 221 such as e.g. a passivation layer or polymide layer. Other embodiments may include an interconnect layer portion with other types of interconnect layers and/or a different number of interconnect layers.

Alignment feature area 123 includes an alignment feature structure 204 located in the final metal interconnect layer 221 of interconnect layer portion 206. Alignment feature structure 204 is made of a highly reflective material such as e.g. copper for providing a high level of reflectivity in response to a laser light. In background area 125, layer 221 is void of the highly reflective material so as to provide a lower level of reflectivity in response to a laser light. In area 125, layer 221 may made of a dielectric material such as TEOS, fluorinated TEOS (FTEOS), a low permitivity film, a plasma enhanced film, or nitride. In the embodiment of FIG. 2, the portions of the layers of the interconnect layer portion 206 not shown to have a metal structure are made of a dielectric material.

Located in metal interconnect layers 225 and 229, are a number of tiles (e.g. 203). These tiles aid in the even polishing of metal interconnect layers 225 and 229 in the area of alignment aid 115 that lacks active circuitry. In one embodiment, to reduce the level of reflectivity due to the tiles in background area 125, the width of the tiles in background area 125 in the scan direction of the laser is less than the wavelength of the laser light. For example, for a laser scan direction from left to right (or right to left), relative to the view shown in FIG. 2, the width of a tile in background area 125 (as designated by the "W" dimension in FIG. 2) is less than the wavelength of the laser light. For alignment aids that are two dimensional (for two orthogonal scan directions), the width of a tile in each direction would be less than the wavelength of the laser light by which the alignment aid is designed to be scanned. In one example where the laser light has a wavelength of 1340 nanometers, the width of the tiles is less than 1340 nanometers. Laser light of other wavelengths e.g. of 532 nm, 1047 nm, and 1064 nm may be utilized to scan an alignment aid. For alignment aids designed for lasers having these wavelengths, the widths of the tiles in the background areas of alignment aids would be less than those wavelengths. In one embodiment, the tiles are 0.6 microns by 0.6 microns. In one embodiment, alignment feature structure 204 is 6.6 microns wide in the scan direction. For a laser light having a wavelength of 1340 nm, one ratio of reflected light to incident light for area 125 may be 203 to 726. For area 123, one ratio of reflected light to incident light may be 570 to 735.

Wafer 101 includes active circuitry located in the lower metal interconnect layers 233 and 237, via layers 235 and 239 and local interconnect layer 241 of background area 125. For example, interconnect conductive structures 205 and 207 are located in layers 233 and 237, respectively, of background area 125. Conductive structures 205 and 207 may be signal conductors or power bus conductors for carrying signals or power for the active circuitry 217 in substrate 215. Conductive structures 205 and 207 are coupled by via 209 in via layer 235.

The level of reflectivity due to the conductive structures (e.g. 205 and 207) in layers 233, 235, 237, 239, and 241 in background area 125 is reduced by the tiles (e.g. 203) located in layers 225 and 229. These tiles act to deflect, block, diffract, and/or diffuse both light from the laser in reaching the conductive structures of layers 233, 235, 237, 239, and 241 and light reflected off of those conductive structures from exiting the top surface of portion 206.

In one embodiment, to reduce the level of reflectivity due to the conductive structures of layers 233, 235, 237, 239, and 241 in background area 125, the spacing between the tiles of layers 225 and 229 in the laser scan directions are less than the wavelength of the laser light. For example, for a laser scan direction from left to right (or right to left), relative to the view shown in FIG. 2, the space between the tiles in background area 125 (as designated by the "S" dimension in FIG. 2) is less than the wavelength of the laser light. For alignment aids that are two-dimensional (e.g. for two orthogonal scan directions), the spacing in each direction would be less than the wavelength of the laser light. Accordingly, for alignment aids designed to be scanned by a laser light having a wavelength of 1340 nm, the spacing between the tiles would be less than 1340 nm.

In addition, the tiles (e.g. 203) of layers 225 and 229 in area 125 also reduce the level of reflectivity due to structures in the substrate including active circuitry such as transistor 218. Furthermore, the tiles (e.g. 203) of layers 225 and 229 in area 125 may also act to protect the active circuitry 217 in substrate 215 from damage due to the laser light.

The tiles are made of the metal of the interconnect layer. In some embodiments, the tiles are made of copper. In other embodiments, the tiles may be made of other metals such as aluminum or gold. In some embodiments, the metal of the layers of interconnect portion 206 may be of different materials. For example the metal of layer 241 may be tungsten, the metal of layers 239, 237, 235, 233, 231, 229, 227, 225, and 223 may of copper, and the metal of layer 221 may be of aluminum. In one embodiment, the layers of interconnect layer portion 206 are formed by a dual in-laid process.

Layers 225 and 229 include tiles located in the alignment feature area 123. In the embodiment shown, these tiles (e.g. 251) have the same width and spacing as the tiles of layers 225 and 229 in background area 125. These tiles in the alignment feature areas are utilized to provide even polishing of layers 225 and 229 in those areas. However, in other embodiments, layers 225 and 229 below alignment feature structure 204 do not have such tiles. In such embodiments, layers 225 and 229 in area 123 may include other types of metal structures, such as e.g. active metal interconnects, to aid in polishing.

With negative density alignment aids such as alignment aid 119 (see FIG. 1), area 123 of FIG. 2 would represent the background area (e.g. 131) having a high level of reflectivity and area 125 represents the feature area (e.g. 135) having a low level of reflectivity. Accordingly, for negative density alignment aids, the tiles in the interconnect layers (e.g. 225 and 229) of the aligned feature area would reduce the level of reflectivity due to structures located below it.

Figure 3:
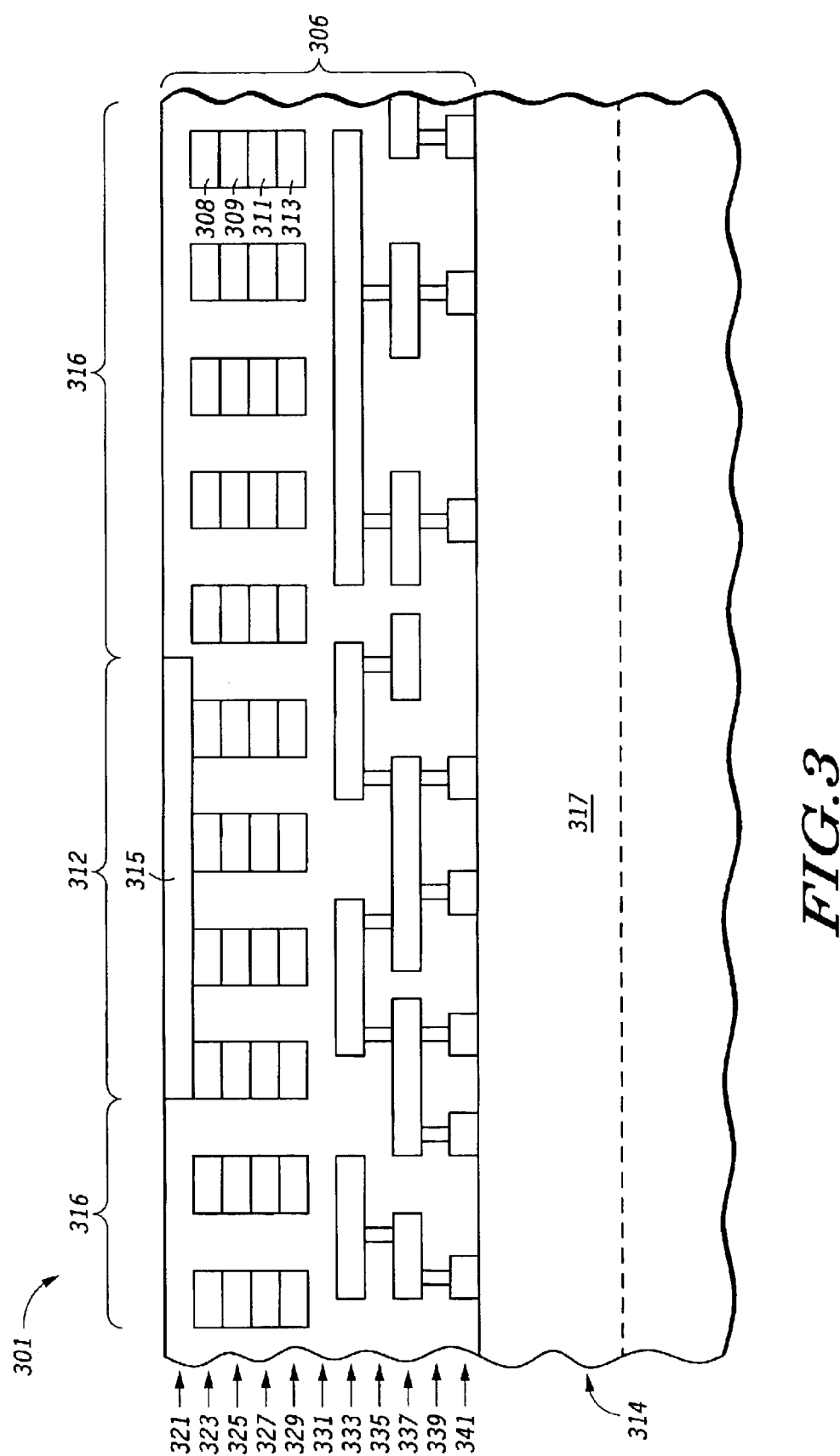
FIG. 3 is partial side view of another embodiment of a semiconductor wafer according to the present invention.

FIG. 3 is a partial side view of a semiconductor wafer 301. Wafer 301 includes an alignment aid that includes an area 312 having a high level of reflectivity and an adjacent area 316 having a lower level of reflectivity. Wafer 301 includes an interconnect layer portion 306 located over a semiconductor substrate 314. Substrate 314 includes active circuitry 317. Interconnect layer portion 306 includes a local interconnect layer 341, a contact interconnect via layer 339, metal interconnect layers 337, 333, 329, and 325, via interconnect layers 335, 331, 327, 323, and a final metal interconnect layer 321. Layer 321 includes a reflective structure 315 in area 312 for providing a high level of reflectivity. For positive density alignment aids, area 312 is the alignment feature area and area 316 is the background area. For negative density alignment aids, area 312 is the background area and area 316 is the alignment feature area.

Wafer 301 differs from wafer 101 in that via interconnect layers 327 and 323 also include tiles (e.g. 308 and 311) located at the same location and having the same width as the tiles (e.g. 309 and 313) of layers 325 and 329. The tiles of layers 323, 325, 327, and 329 act to reduce the level of reflectivity of area 316 due to the reflections of a laser light from structures below layers 329, 327, 325, and 323.

In one embodiment, the interconnect layers of portion 306 of wafer 301 are made from a single, in-laid process. Accordingly, tiles (e.g. 308 and 311) in via interconnect layers 323 and 327 are utilized to provide even polishing of those layers.

In another embodiment, the tiles in the interconnect layers are electrically coupled together so as to facilitate design rule checks and to control parasitics due to floating conductive structures. In one example of this embodiment, layer 329 would include a number of grid lines that are electrically connected to the tiles of layer 327. The grid lines would be electrically coupled together and may be grounded. Accordingly, in this embodiment, the tiles of layers 323, 325, and 327 would be grounded.

In other embodiments, the tiles in the interconnect layers may have different sizes, shapes, and/or configurations. For example, referring to FIG. 2, each of the tiles of layer 225 are located directly over a tile of layer 229. However, in other embodiments, each tile of layer 225 may be staggered from a tile of layer 229 such that a tile of layer 225 is located at least partially over a space between two tiles of layer 229.

In the embodiment of FIG. 2, wafer 101 includes two layers of tiles (one in layer 225 and one in layer 229) in the area 125. Other alignment aids according to the present invention may include only one layer of tiles or more than two layers of tiles in the area having a low level of reflectivity. However, with some embodiments, a reduction in the level of reflectivity due to 3 or more layers of tiles may be minimal.

In one aspect, the invention includes an alignment aid for a semiconductor device. The alignment aid includes a first area having a first level of reflectivity and a second area adjacent to the first area and having a second level reflectivity that is less than the first level of reflectivity. The second area includes at least one layer of tiles. Each layer of the at least one layer of tiles is located in an interconnect layer. The at least one layer of tiles is located directly over active circuitry of the semiconductor device.

In another aspect of the invention, a semiconductor device includes a semiconductor substrate and an interconnect layer portion including a plurality of interconnect layers located over the semiconductor substrate. The semiconductor device also includes an alignment aid including a first area having a first level of reflectivity and a second area adjacent to the first area and having a second level of reflectivity that is less than the first level. The interconnect layer portion includes at least one layer of tiles located in the second area. Each layer of the at least one layer of tiles is located in an interconnect layer of the plurality. The semiconductor device further includes active circuitry located directly below the at least one layer of tiles.

In another aspect, the invention includes a method of implementing an alignment aid in a semiconductor device. The method includes providing a first area having a first level of reflectivity in a predetermined portion of the semiconductor device and providing a second area adjacent to the first area and having a second level of reflectivity that is less than the first level of reflectivity. The second area includes at least one layer of tiles. Each of the at least one layer of tiles is located in an interconnect layer of the semiconductor device. The method further includes providing active circuitry that is directly below the at least one layer of tiles.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. An alignment aid for a semiconductor device, the alignment aid comprising:
   a first area having a first level of reflectivity;
   a second area adjacent to the first area and having a second level reflectivity that is less than the first level of reflectivity, wherein the second area includes at least one interconnect layer; and
   wherein the at least one layer of tiles is located directly over active circuitry of the semiconductor device.

2. The alignment aid of claim 1 wherein the first area comprises an alignment feature area and the second area comprises a background area.

3. The alignment aid of claim 1 wherein the first area comprises a background area and the second area comprises an alignment feature area.

4. The alignment aid of claim 1 wherein each layer of tiles of the at least one layer of tiles further comprise:
   a plurality of dies located in an interconnect layer, each tile of the plurality is spaced apart from an adjacent tile of the plurality in a laser scan direction of the alignment aid by a spacing that is less than a wavelength of a laser light by which the alignment aid is designed to be scanned.

5. The alignment aid of claim 1 wherein each layer of tiles of the at least one layer of tiles further comprise:
   a plurality of tiles located in an interconnect layer, each tile of the plurality is spaced apart from an adjacent tile of the plurality in a laser scan direction of the alignment aid by a spacing that is less than 1340 nm.

6. The alignment aid of claim 1 wherein the at least one layer of tiles further comprise:
   a plurality of tiles, each tile of the plurality having a width in a laser scan direction of the alignment aid that is less than a wavelength of a laser light by which the alignment aid is designed to be scanned.

7. The alignment aid of claim 1 wherein each layer of the at least one layer of tiles further comprises:
   a plurality of tiles, each tile of the plurality is spaced apart from an adjacent tile of the plurality in a laser scan direction of the alignment aid by a spacing that is less than a wavelength of a laser light by which the alignment aid is designed to be scanned.

8. The alignment aid of claim 1 wherein each layer of the at least one layer of tiles further comprises:
   a plurality of tiles, each tile of the plurality having a width in a laser scan direction of the alignment aid that is less than a wavelength of a laser light by which the alignment aid is designed to be scanned.

9. The alignment aid of claim 1 wherein each layer of the at laser one layer of tiles further comprises:
   a plurality of tiles, each tile of the plurality is spaced apart from an adjacent tile structure of the plurality in a laser scan direction of the alignment aid by a spacing that is less than 1340 nm.

10. The alignment aid of claim 1 wherein the at least one layer of tiles further comprise:
    a plurality of tile structures, each tile structure of the plurality having a width in a laser scan direction of the alignment aid that is less than a wavelength of a laser light by which the alignment aid is designed to be scanned.

11. The alignment aid of claim 1 wherein a that layer of tiles of the at least one layer is located in a first interconnect layer and a second layer of tiles of the at least one layer is located in a second interconnect layer, wherein the first layer of tiles and the second layer of tiles are separated by a layer of dielectric material.

12. The alignment aid of claim 1 wherein:
wherein the at least one layer of tiles is located in an interconnect portion;
the interconnect layer portion includes a first number of interconnect layer, wherein each of a second number of layers of the interconnect layer portion includes a layer of tiles of the at least one layer of tiles, wherein the first number is greater than the second number.

13. The alignment aid of claim 12 wherein the second number is two.

14. The alignment aid of claim 1 wherein the active circuitry includes active circuitry in a substrate.

15. The alignment aid of claim 12 wherein the active circuitry includes conductive interconnect structures in an interconnect layer of the interconnect layer portion below the interconnect layers that the at least one layer of tiles are located.

16. The alignment aid of claim 1 wherein the first area includes am alignment feature structure of a reflective material in a top layer of a plurality of interconnect layers.

17. The alignment aid or claim 16 wherein the second area includes a dielectric material in the top layer.

18. The semiconductor device alignment aid of claim 16 wherein the at least one layer of tiles are located in interconnect layers of the plurality of interconnect layers below the top layer.

19. The semiconductor device of claim 1 further comprising:
at least one layer of tiles located below the alignment aid in the first area, each layer of tiles of the at least one layer of tiles in the first area is located in an interconnect layer that a layer of tiles of the at least one layer of tiles in the second area is located.

20. The alignment aid of claim 1 wherein:
the alignment aid includes a first laser scan direction and a second laser scan direction generally orthogonal to the first laser scan direction;
each layer of tiles of the at least one layer tiles further comprises a plurality of tile structures;
each tile structure of the plurality is spaced apart from an adjacent tile structure of the plurality in the first laser scan direction and in the second laser scan direction by a spacing that is less than 1340 nm.

21. The alignment aid of claim 1 wherein the at least one layer of tiles includes a first layer of tiles located in a first interconnect layer and a second layer of tiles located in a second interconnect layer, wherein each tile of the first layer is electrically coupled to a tile of the second layer.

22. A semiconductor device including the alignment aid of claim 1, the device further comprising:
a substrate, the active circuitry located in the substrate;
an interconnect layer portion including a plurality of interconnect layers located over the substrate, the at least one layer of tiles located in the interconnect portion.

* * * * *

UNITED STATES PATENT AND TRADEMARK OFFICE
CERTIFICATE OF CORRECTION

| | | |
|---|---|---|
| PATENT NO. | : 6,933,523 B2 | Page 1 of 1 |
| APPLICATION NO. | : 10/402539 | |
| DATED | : August 23, 2005 | |
| INVENTOR(S) | : Stephen G. Sheck | |

It is certified that error appears in the above-identified patent and that said Letters Patent is hereby corrected as shown below:

In the Claims

Column 6, line 11, correct "at least one interconnect" to be -- at least one layer of tiles, each layer of the at least one layer of tiles is located in an interconnect --

Column 7, line 1, correct "a that layer" to be -- a first layer --

Column 7, line 11, correct "layer, wherein" to be -- layers, wherein --

Column 7, line 25, correct "includes am" to be -- includes an --

Column 7, line 27, correct "aid or" to be -- aid of --

Column 8, line 12, correct "layer tiles" to be -- layer of tiles --

Signed and Sealed this
Eleventh Day of August, 2015

Michelle K. Lee
*Director of the United States Patent and Trademark Office*